US012787356B2

(12) United States Patent
Ko et al.

(10) Patent No.: US 12,787,356 B2
(45) Date of Patent: Nov. 3, 2026

(54) THIN FILM TRANSISTOR AND DISPLAY DEVICE

(71) Applicant: LG Display Co., Ltd., Seoul (KR)

(72) Inventors: YoungHyun Ko, Gyeongsangnam-do (KR); ChanYong Jeong, Paju-si (KR); JuHeyuck Baeck, Paju-si (KR); GaWon Yang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 392 days.

(21) Appl. No.: 18/532,865

(22) Filed: Dec. 7, 2023

(65) Prior Publication Data

US 2024/0222512 A1 Jul. 4, 2024

(30) Foreign Application Priority Data

Dec. 30, 2022 (KR) ........................ 10-2022-0191296

(51) Int. Cl.
*H10D 30/67* (2025.01)
*H10D 64/62* (2025.01)

(52) U.S. Cl.
CPC ..... *H10D 30/6715* (2025.01); *H10D 30/6723* (2025.01); *H10D 30/6729* (2025.01); *H10D 64/62* (2025.01)

(58) Field of Classification Search
CPC ........... H10D 30/6715; H10D 30/6723; H10D 30/6729; H10D 64/62; H10D 30/67; H10D 30/6755; H10D 30/6757; H10D 62/235; H10K 59/1213; H10K 59/126
See application file for complete search history.

(56) References Cited

U.S. PATENT DOCUMENTS

| | | | | |
|---|---|---|---|---|
| 9,671,646 | B1 * | 6/2017 | Tang | H10D 30/6715 |
| 2006/0246360 | A1 * | 11/2006 | Hwang | H10D 30/6715 257/E27.111 |
| 2011/0284851 | A1 * | 11/2011 | Liu | H10D 30/6734 257/E33.003 |
| 2012/0146043 | A1 | 6/2012 | Kitakado | |
| 2017/0186783 | A1 * | 6/2017 | Hu | H10D 30/6732 |
| 2020/0357702 | A1 * | 11/2020 | Chen | H10D 84/038 |
| 2021/0399142 | A1 | 12/2021 | Jeong et al. | |
| 2022/0190170 | A1 | 6/2022 | Lee et al. | |

FOREIGN PATENT DOCUMENTS

| | | | |
|---|---|---|---|
| KR | 10-2174921 | B1 | 11/2020 |
| KR | 10-2255589 | B1 | 5/2021 |
| KR | 10-2021-0157801 | A | 12/2021 |
| KR | 10-2022-0070763 | A | 5/2022 |
| KR | 10-2022-0084837 | A | 6/2022 |

OTHER PUBLICATIONS

Korean Intellectual Property Office, Office Action, Korean Patent Application No. 10-2022-0191296, Sep. 25, 2025, 18 pages.

* cited by examiner

*Primary Examiner* — Su C Kim
(74) *Attorney, Agent, or Firm* — Fenwick & West LLP

(57) ABSTRACT

Provided are a thin film transistor and a display device. The thin film transistor has a structure in which an active layer has an induced conductorized portion located between a main conductorized portion and a channel area, with the induced conductorized portion overlapping a portion of one side of a light shield layer. The possibility of damage to the active layer is removed or minimized. A short channel is easily realized.

15 Claims, 22 Drawing Sheets

THIN FILM TRANSISTOR AND DISPLAY DEVICE

CROSS-REFERENCE TO RELATED APPLICATION

This application claims the benefit of Republic of Korea Patent Application No. 10-2022-0191296, filed on Dec. 30, 2022, which is hereby incorporated by reference in its entirety.

BACKGROUND

Field

Embodiments relate to a thin film transistor (TFT) and a display device.

Description of Related Art

Transistors are widely used as switching devices or driving devices in the field of electronic devices. In particular, thin film transistors (TFTs) are widely used as switching devices of display devices, such as a liquid crystal display device or an organic light-emitting display device, since TFTs may be manufactured on a glass substrate or a plastic substrate.

TFTs may be categorized as amorphous silicon TFTs (a-Si TFTs) in which amorphous Si is used as an active layer, polycrystalline Si TFTs (poly-Si TFTs) in which polycrystalline Si is used as an active layer, and oxide semiconductor TFTs in which oxide semiconductor is used as an active layer, according to the material of an active layer.

Here, a-Si TFTs advantageously have a short manufacturing process time and low production costs, since amorphous Si may be deposited in a short amount of time to form an active layer. However, the use of a-Si TFTs in organic light-emitting display devices and the like is disadvantageously limited, due to low mobility, poor current driving ability, and variations in threshold voltage of a-Si TFTs.

Poly-Si TFTs are formed by crystallization of amorphous Si subsequently to the deposition thereof. Since the crystallization of amorphous Si is required in a manufacturing process of poly-Si TFTs, the number of processing operations may be increased, thereby increasing manufacturing costs. In addition, since the crystallization is performed at a high processing temperature, it may be difficult to use poly-Si TFTs in large area displays. In addition, due to poly-crystalline properties, it is difficult to obtain uniformity in poly-Si TFTs.

Oxide semiconductor TFTs have an advantage in that intended physical properties may be easily obtained therewith, since an oxide of an active layer may be formed at a relatively low temperature, mobility is high, and there are significant changes in resistance depending on the content of oxygen. In addition, the oxide semiconductor is transparent due to the nature of the oxide and thus is advantageous for realizing a transparent display. However, in order to use an oxide semiconductor layer in TFTs, separate conductorization processing for forming a connecting portion between a source electrode and a drain electrode is required.

In addition, when forming a TFT, a gate insulator layer is formed above a semiconductor layer, and the gate insulator layer is etched for a variety of reasons. During the etching of the gate insulator layer, the semiconductor layer may be removed (or lost), damaged, or fragmented.

SUMMARY

Embodiments of the present disclosure may provide a thin film transistor (TFT) having a structure able to remove or minimize the possibility that a semiconductor layer may be damaged, and a display device including the same.

Embodiments of the present disclosure may provide a TFT having a structure able to provide superior electrical properties (e.g., current characteristics or mobility) while removing or minimizing the possibility that a semiconductor layer may be damaged, and a display device including the same.

Embodiments of the present disclosure may provide a TFT able to operate at low power, and a display device including the same.

A thin film transistor (TFT) according to embodiments may include: a substrate; a main light shield layer located on the substrate; a first buffer layer located on the main light shield layer; an active layer located on the first buffer layer and including a channel area, a first area located on one side of the channel area, and a second area located on the other side of the channel area, wherein the first area includes a first main conductorized portion and a first induced conductorized portion, and the second area includes a second main conductorized portion and a second induced conductorized portion; a gate insulator layer located on the active layer; a main source electrode located on the gate insulator layer and electrically connected to the first main conductorized portion; a main drain electrode located on the gate insulator layer and electrically connected to the second main conductorized portion; and a gate electrode located on the gate insulator layer and overlapping the channel area.

The first induced conductorized portion may be located between the first main conductorized portion and the channel area, may not overlap the main source electrode, and may overlap a portion of one side of the main light shield layer.

The second induced conductorized portion may be located between the second main conductorized portion and the channel area, may not overlap the main drain electrode, and may overlap a portion of the other side of the main light shield layer.

According to embodiments, a TFT having a structure able to remove or minimize the possibility that a semiconductor layer may be damaged and a display device including the same may be provided.

According to embodiments, a TFT having a structure able to provide superior electrical properties (e.g., current characteristics or mobility) while removing or minimizing the possibility that a semiconductor layer may be damaged and a display device including the same may be provided.

According to embodiments, a TFT having a structure in which a light shield layer is disposed below a first induced conductorized portion and a second induced conductorized portion to reduce the resistance of the active layer through a gate field generated in a light shield layer, thereby minimizing the channel length of an active layer, and a display device including the same may be provided.

According to embodiments, a TFT able to operate at low power and a display device including the same may be provided.

BRIEF DESCRIPTION OF THE DRAWINGS

The above and other objectives, features, and advantages of the present disclosure will be more clearly understood from the following detailed description, taken in conjunction with the accompanying drawings, in which.

DETAILED DESCRIPTION

Figure 1:
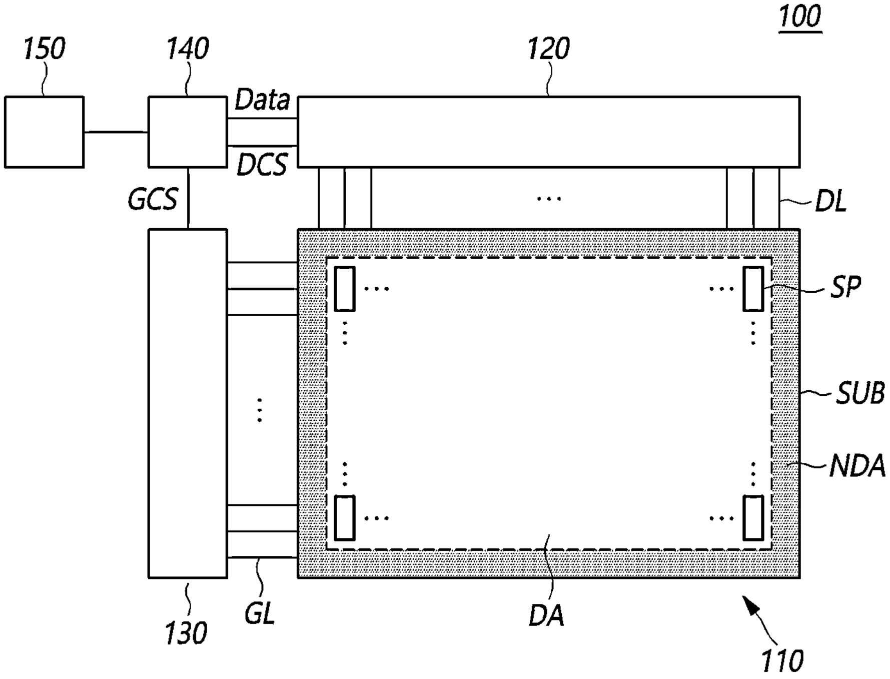
FIG. 1 is a diagram illustrating a system configuration of a display device according to embodiments.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting", "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompass all the meanings of the term "can".

Hereinafter, a variety of embodiments of the present disclosure will be described in detail with reference to the accompanying drawings.

FIG. 1 is a diagram illustrating a system configuration of a display device 100 according to embodiments.

Referring to FIG. 1, the display device 100 according to embodiments may include a display panel 110 and a driver circuit driving the display panel 110.

The driver circuit may include a data driver circuit 120, a gate driver circuit 130, and the like. The driver circuit may further include a controller 140 to control the data driver circuit 120 and gate driver circuit 130.

The display panel 110 may include a substrate SUB and signal lines (also referred to as conductive lines) such as a plurality of data lines DL and a plurality of gate lines GL disposed on the substrate SUB. The display panel 110 may include a plurality of subpixels SP connected to the plurality of data lines DL and the plurality of gate lines GL.

The display panel 110 may include a display area (or active area) DA on which images are displayed and a non-display area (or non-active area) NDA located around the display area DA and on which no images are displayed. In the display panel 110, the plurality of subpixels SP for displaying images are disposed in the display area DA, a pad part may be disposed in the non-display area NDA. Here, the driver circuits 120, 130, and 140 may be electrically connected to or mounted on the pad part, and integrated circuits, printed circuits, and the like may be connected to the pad part.

The data driver circuit 120 is a circuit for driving the plurality of data lines DL, and may supply data signals to the plurality of data lines DL. The gate driver circuit 130 is a circuit for driving the plurality of gate lines GL, and may supply gate signals to the plurality of gate lines GL. The controller 140 may supply a data control signal DCS to the data driver circuit 120 in order to control operation timing of the data driver circuit 120. The controller 140 may supply a gate control signal GCS to the gate driver circuit 130 in order to control operation timing of the gate driver circuit 130.

The controller 140 may generate data drive control signals DCS and gate drive control signals GCS on the basis of the display drive control signals input from the host system 150. The controller 140 may control a scanning operation to start at timing realized for respective frames, convert image data input from an external source into a data signal format used by the data driver circuit 120, supply the converted image data Data to the data driver circuit 120, and control data driving to be performed at appropriate times according to the timing of the scanning.

The controller 140 may output a variety of gate control signals GCS including a gate start pulse (GSP), a gate shift clock (GSC), a gate output enable signal (GOE), and the like in order to control the gate driver circuit 130.

The controller 140 may output a variety of data control signals DCS including a source start pulse (SSP), a source sampling clock (SSC), a source output enable signal (SOE), and the like in order to control the data driver circuit 120.

The controller 140 may be provided as a component separate from the data driver circuit 120 or may be combined with the data driver circuit 120 into an integrated circuit.

The data driver circuit 120 drives the plurality of data lines DL by supplying data voltages to the plurality of data lines DL in response to the image data Data input from the controller 140. Here, the data driver circuit 120 will also be referred to as a source driver circuit.

The data driver circuit 120 may include one or more source driver integrated circuits (SDICs).

For example, each of the SDICs may be connected to the display panel 110 using a tape-automated bonding (TAB) structure, may be connected to a bonding pad of the display panel 110 using a chip-on-glass (COG) structure or a chip-on-panel (COP) structure, or may be implemented using a chip-on-film (COF) structure connected to the display panel 110.

The gate driver circuit 130 may output a gate signal having a turn-on-level voltage or a gate signal having a turn-off-level voltage under the control of the controller 140. The gate driver circuit 130 may sequentially drive the plurality of gate lines GL by sequentially supplying the gate signal having a turn-on-level voltage to the plurality of gate lines GL.

The gate driver circuit 130 may be connected to the display panel 110 using a TAB structure, may be connected to bonding pads of the display panel 110 using a COG structure or a COP structure, or may be connected to the display panel 110 using a COF structure. Alternatively, the gate driver circuit 130 may be provided in the non-display area NDA of the display panel 110 using a gate-in-panel (GIP) structure. The gate driver circuit 130 may be disposed on or connected to the substrate SUB. That is, when the gate driver circuit 130 has a GIP structure, the gate driver circuit 130 may be disposed in the non-display area NDA of the substrate SUB. When the gate driver circuit 130 has a COG structure, a COF structure, or the like, the gate driver circuit 130 may be connected to the substrate SUB.

At least one driver circuit of the data driver circuit 120 and the gate driver circuit 130 may be disposed in the display area DA. For example, at least one driver circuit of the data driver circuit 120 and the gate driver circuit 130 may be disposed so as not to overlap the subpixels SP or such that a portion or the entirety thereof overlaps the subpixels SP.

When a specific gate line GL is opened by the gate driver circuit 130, the data driver circuit 120 may convert image data Data received from the controller 140 into analog data voltages and supply the analog data voltages to the plurality of data lines DL.

The data driver circuit 120 may be connected to one side (e.g., the upper portion or lower portion) of the display panel 110. The data driver circuit 120 may be connected to both sides (e.g., the upper portion and the lower portion) of the display panel 110 or two or more sides of four sides of the display panel 110, depending on the driving method, the design of the display panel, or the like.

The gate driver circuit 130 may be connected to one side (e.g., the left portion or right portion) of the display panel 110. The gate driver circuit 130 may be connected to both sides (e.g., the left portion and the right portion) of the display panel 110 or two or more sides of four sides of the display panel 110, depending on the driving method, the design of the display panel, or the like.

The controller 140 may be a timing controller used in typical display technology, may be a control device including a timing controller and able to perform other control functions, may be a control device different from the timing controller, or a circuit inside a control device. The controller 140 may be implemented using a variety of circuits or electronic components such as an integrated circuit (IC), a field programmable gate array (FPGA), an application specific integrated circuit (ASIC), or a processor.

The controller 140 may be mounted on a printed circuit board (PCB), a flexible printed circuit (FPC), or the like, or may be electrically connected to the data driver circuit 120 and the gate driver circuit 130 through the PCB, the FPC, or the like.

The display device 100 according to embodiments may be a display device including a backlight unit such as a liquid crystal display (LCD), or may be a self-light-emitting display device, such as an organic light-emitting diode (OLED) display, a quantum dot display, or a micro-light-emitting diode (micro-LED) display.

When the display device 100 according to embodiments is an OLED display device, each of the subpixels SP may include an OLED, a self-light-emitting diode, as a light-emitting device. When the display device 100 according to embodiments is a quantum dot display device, each of the subpixels SP may include a light-emitting device comprised of a quantum dot forming a self-light-emitting semiconductor crystal. When the display device 100 according to embodiments is a micro-LED display device, each of the subpixels SP may include a micro-LED based on an inorganic material and capable of emit light by itself as a light-emitting device.

The display panel 110 according to embodiments may have a top emission structure or a bottom emission structure, or in some cases, may have a structure by which light is emitted from both sides.

Figure 2:
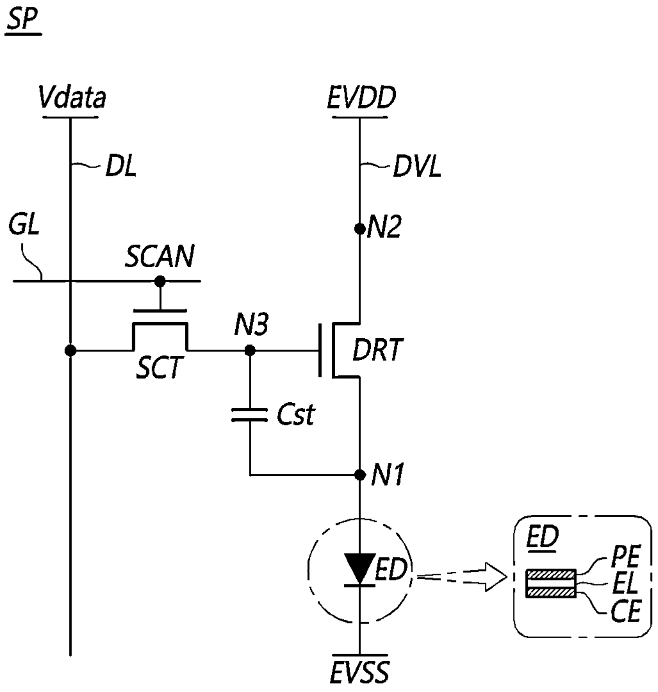
FIG. 2 is a diagram illustrating an equivalent circuit of a subpixel of the display device according to embodiments.
Figure 3:
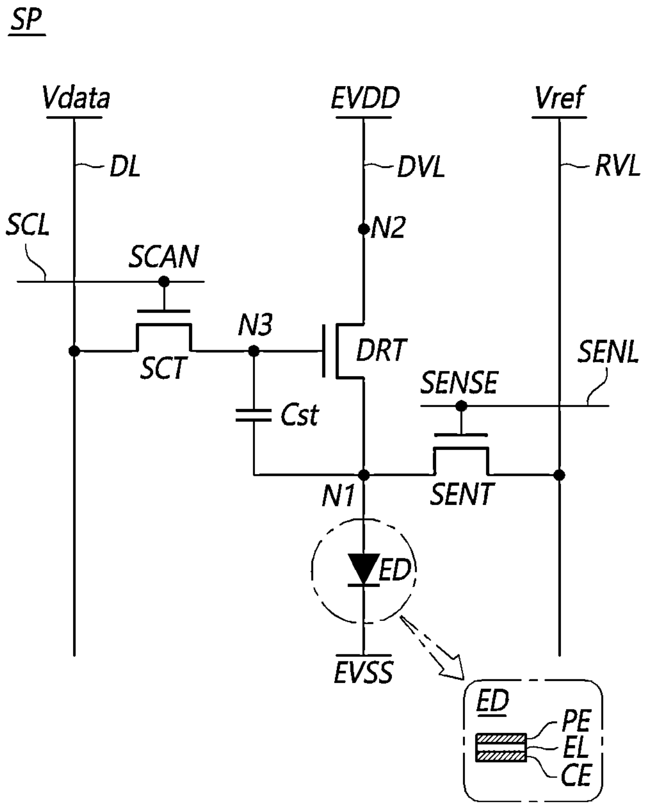
FIG. 3 is a diagram illustrating another equivalent circuit of a subpixel of the display device according to embodiments.

FIG. 2 is a diagram illustrating an equivalent circuit of a subpixel SP of the display device 100 according to embodiments, and FIG. 3 is a diagram illustrating another equivalent circuit of a subpixel SP of the display device 100 according to embodiments.

Referring to FIG. 2, each of the plurality of subpixels SP disposed in the display panel 110 of the display device 100 according to embodiments may include an emitting device ED, a driving transistor DRT, a scanning transistor SCT, and a storage capacitor Cst.

Referring to FIG. 2, the emitting device ED may include a pixel electrode PE, a common electrode CE, and an emitting layer EL located between the pixel electrode PE and the common electrode CE.

The pixel electrode PE of the emitting device ED may be an electrode disposed in each of the subpixels SP, and the common electrode CE may be an electrode disposed in common in all of the subpixels SP. Here, the pixel electrode PE may be an anode, and the common electrode CE may be a cathode. In contrast, the pixel electrode PE may be a cathode, and the common electrode CE may be an anode.

For example, the emitting device ED may be an OLED, a LED, a quantum dot light-emitting device, or the like.

A base voltage EVSS corresponding to a common voltage may be applied to the common electrode CE of the emitting device ED. Here, the base voltage EVSS may be, for example, a ground voltage or a voltage similar to the ground voltage.

The driving transistor DRT may be a transistor for driving the emitting device ED, and may include a first node N1, a second node N2, a third node N3, and the like. Here, the first node N1 may also be referred to as a first electrode, the second node N2 may also be referred to as a second electrode, and the third node N3 may also be referred to as a third electrode.

The first node N1 of the driving transistor DRT may be a source node (or source electrode) or a drain node (or drain electrode) of the driving transistor DRT, and may be electrically connected to the pixel electrode PE of the emitting device ED. The second node N2 of the driving transistor DRT may be a drain node (or drain electrode) or a source node (or source electrode) of the driving transistor DRT, and may be electrically connected to a drive voltage line DVL through which a drive voltage EVDD is supplied. The third node N3 of the driving transistor DRT may be a gate node (or gate electrode) of the driving transistor DRT, and may be electrically connected to a source node or a drain node of the scanning transistor SCT.

The scanning transistor SCT may be controlled by a scanning gate signal SCAN, i.e., a type of gate signal, and may be connected between the third node N3 of the driving transistor DRT and a data line DL. In other words, the scanning transistor SCT may be turned on or off by the scanning gate signal SCAN supplied through a scanning gate line SCL, i.e., a type of gate line GL, to control the connection between the data line DL and the third node N3 of the driving transistor DRT.

The scanning transistor SCT may be turned on by the scanning gate signal SCAN having a turn-on-level voltage to transfer a data voltage Vdata supplied through the data line DL to the third node N3 of the driving transistor DRT.

Here, when the scanning transistor SCT is an n-type transistor, the turn-on-level voltage of the scanning gate signal SCAN may be a high-level voltage. When the scanning transistor SCT is a p-type transistor, the turn-on-level voltage of the scanning gate signal SCAN may be a low-level voltage.

The storage capacitor Cst may be connected to the third node N3 and the first node N1 of the driving transistor DRT. The storage capacitor Cst is charged with an amount of electric charge corresponding to the voltage difference between both ends, and serves to maintain the voltage difference between both ends during a predetermined frame time. Thus, the corresponding subpixel SP may emit light during the predetermined frame time.

Referring to FIG. 3, each of the plurality of subpixels SP disposed in the display panel 110 of the display device 100 according to embodiments may further include a sensing transistor SENT.

The sensing transistor SENT may be controlled by a sensing gate signal SENSE, i.e., a type of gate signal, and may be connected to the first node N1 of the driving transistor DRT and a reference voltage line RVL. In other words, the sensing transistor SENT may be turned on or off by the sensing gate signal SENSE supplied through a sensing gate line SENL, i.e., a type of gate line GL, to control the connection between the reference voltage line RVL and the first node N1 of the driving transistor DRT.

The sensing transistor SENT may be turned on by the sensing gate signal SENSE having a turn-on-level voltage to transfer a reference voltage Vref supplied through the reference voltage line RVL to the first node N1 of the driving transistor DRT.

Alternatively, the sensing transistor SENT may be turned on by the sensing gate signal SENSE having a turn-on-level voltage to transfer the voltage of the first node of the driving transistor DRT to the reference voltage line RVL.

Here, when the sensing transistor SENT is an n-type transistor, the turn-on-level voltage of the sensing gate signal SENSE may be a high-level voltage. When the sensing transistor SENT is a p-type transistor, the turn-on-level voltage of the sensing gate signal SENSE may be a low-level voltage.

The function of the sensing transistor SENT transferring the voltage of the first node N1 of the driving transistor DRT to the reference voltage line RVL may be used in driving for sensing characteristics of the subpixel SP. In this case, the voltage transferred to the reference voltage line RVL may be a voltage by which the characteristics of the subpixel SP are calculated or a voltage in which the characteristics of the subpixel SP are reflected.

Each of the driving transistor DRT, the scanning transistor SCT, and the sensing transistor SENT may be an n-type transistor or a p-type transistor. In the present disclosure, for the convenience of explanation, each of the driving transistor DRT, the scanning transistor SCT, and the sensing transistor SENT are illustrated as being an n-type transistor.

The storage capacitor Cst may be an external capacitor intentionally designed to be provided externally of the driving transistor DRT, rather than a parasitic capacitor (e.g., Cgs or Cgd), i.e., an internal capacitor present between the gate node and the source node of the driving transistor DRT.

The scanning gate line SCL and the sensing gate line SENL may be different gate lines GL. In this case, the scanning gate signal SCAN and the sensing gate signal SENSE may be different gate signals, and on-off timing of the scanning transistor SCT and on-off timing of the sensing transistor SENT in a single subpixel SP may be independent of each other. That is, on-off timing of the scanning transistor SCT and on-off timing of the sensing transistor SENT in the single subpixel SP may be the same or different.

Alternatively, the scanning gate line SCL and the sensing gate line SENL may be the same gate line GL. That is, the gate node of the scanning transistor SCT and the gate node of the sensing transistor SENT in the single subpixel SP may be connected to a single gate line GL. In this case, the scanning gate signal SCAN and the sensing gate signal SENSE may be the same gate signal, and on-off timing of the scanning transistor SCT and on-off timing of the sensing transistor SENT in the single subpixel SP may be the same.

The structures of the subpixels SP illustrated in FIGS. 2 and 3 are illustrative only, the subpixel structures may have a variety of modifications each further including one or more transistors or one or more capacitors.

In addition, although the subpixel structure has been described with reference to FIGS. 2 and 3 by assuming that the display device 100 is a self-light-emitting device, when the display device 100 is an LCD, each of the subpixels SP may include a transistor, a pixel electrode, and the like.

Figure 4:
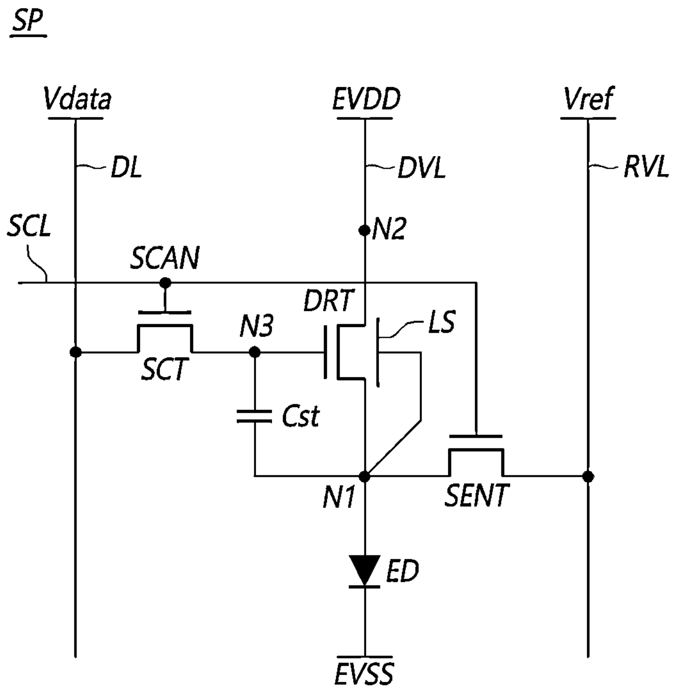
FIG. 4 is a diagram illustrating an equivalent circuit of a subpixel of the display device according to embodiments to which a light shield is added.

FIG. 4 is a diagram illustrating an equivalent circuit of a subpixel SP of the display device 100 according to embodiments to which a light shield (LS) is added.

Referring to FIG. 4, in each of the subpixels SP of the display device 100 according to embodiments, the driving transistor DRT may have unique characteristics such as a threshold voltage and mobility. When the unique characteristics of the driving transistor DRT are changed, current driving ability (i.e., current supply performance) of the driving transistor DRT may also be changed, thereby changing light-emitting characteristics of the corresponding subpixel SP.

Device characteristics (e.g., threshold voltage and mobility) of the driving transistor DRT may change as the driving time of the driving transistor DRT passes. In addition, when light strikes the driving transistor DRT, in particular, when light strikes a channel area of the driving transistor DRT, the device characteristics (e.g., threshold voltage and mobility) of the driving transistor DRT may be changed.

Thus, as illustrated in FIG. 4, a light shield may be provided adjacent to the driving transistor DRT in order to reduce changes in the device characteristics (e.g., threshold voltage and mobility) of the driving transistor DRT. For example, the light shield may be provided below the channel area of the driving transistor DRT.

In addition, the light shield may be provided below the channel area of the driving transistor DRT to serve as a body of the driving transistor DRT, in addition to blocking light.

The body effect may be generated in the driving transistor DRT. In order to reduce the influence of the body effect, the light shield serving as the body of the driving transistor DRT may be electrically connected to the first node N1 of the driving transistor DRT. Here, the first node N1 of the driving transistor DRT may be a source node of the driving transistor DRT.

In addition, the light shield may be disposed not only below the channel area of the driving transistor DRT but also below a channel area of another transistor (e.g., SCT or SENT).

In the display area DA of the display panel 110 according to embodiments, the transistors DRT, SCT, and SENT may be disposed in each of the subpixels SP. When the gate driver circuit 130 having a GIP structure is provided in the non-display area NDA of the display panel 110 according to embodiments, a plurality of transistors included in the gate driver circuit 130 having a GIP structure may be disposed in the non-display area NDA of the display panel 110.

As described above, the scanning gate line SCL and the sensing gate line SENL may be different gate lines GL. In this case, the scanning gate signal SCAN and the sensing gate signal SENSE may be different gate signals. On-off timing of the scanning transistor SCT and on-off timing of the sensing transistor SENT in a single subpixel SP may be independent of each other. That is, on-off timing of the scanning transistor SCT and on-off timing of the sensing transistor SENT in the single subpixel SP may be the same or different.

Alternatively, as illustrated in FIG. 4, the scanning gate line SCL and the sensing gate line may be the same gate line. That is, the gate node of the scanning transistor SCT and the gate node of the sensing transistor SENT in the single subpixel SP may be connected to the scanning gate line SCL, i.e., a single gate line GL. In this case, the scanning gate signal SCAN and the sensing gate signal SENSE may be the same gate signal, and on-off timing of the scanning transistor SCT and on-off timing of the sensing transistor SENT in the single subpixel SP may be the same. Hereinafter, for the convenience of explanation, as illustrated in FIG. 4, an example in which a single scanning gate line SCL is connected in common to the gate node of the scanning transistor SCT and the gate node of the sensing transistor SENT will be provided, and an example in which a single scanning gate signal SCAN is supplied in common to the gate node of the scanning transistor SCT and the gate node of the sensing transistor SENT will be provided.

Figure 5:
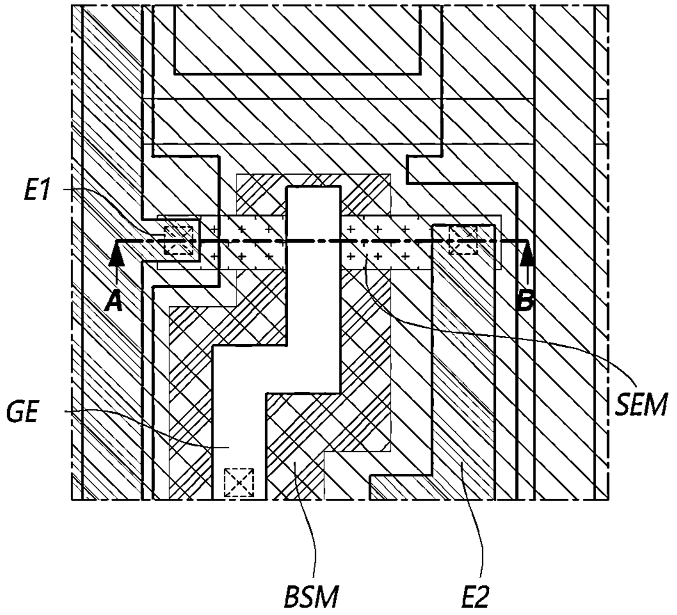
FIG. 5 is a plan diagram illustrating a portion of the area of a subpixel in the display device according to embodiments.

FIG. 5 is a plan diagram illustrating a portion of the area of a subpixel SP in the display device according to embodiments.

Referring to FIG. 5, a thin film transistor (TFT) may include a first electrode E1, a second electrode E2, a gate electrode GE, a light shield BSM, and a semiconductor layer SEM. The first electrode E1 may be a source electrode, and the second electrode E2 may be a drain electrode. Alternatively, the first electrode E1 may be a drain electrode, and the second electrode E2 may be a source electrode. Hereinafter, for the convenience of explanation, an example in which the first electrode E1 is a source electrode and the second electrode E2 is a drain electrode will be provided.

Figure 6:
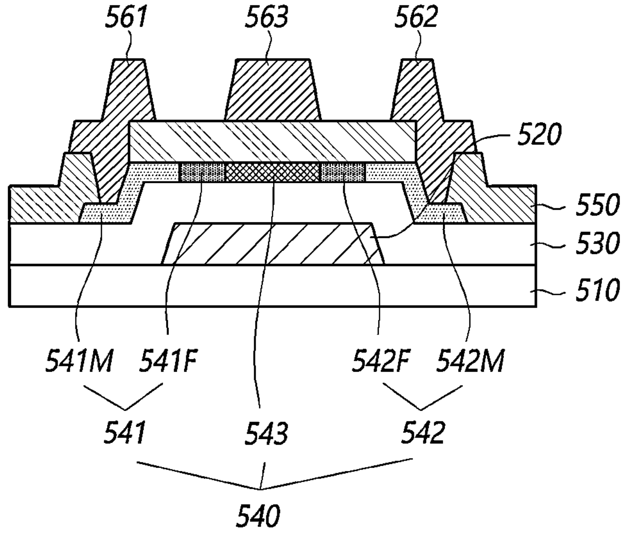
FIG. 6 is a cross-sectional diagram illustrating the structure of a TFT provided in the display device according to embodiments.

FIG. 6 is a cross-sectional diagram illustrating the structure of a TFT provided in the display device according to embodiments. For example, FIG. 6 is a cross-sectional view illustrating an example structure, taken along line A-B of FIG. 5.

Referring to FIG. 6, the TFT provided in the display device according to embodiments may include an active layer 540, a gate insulator layer (GI) 550, a main source electrode 561, a main drain electrode 562, a gate electrode 563, and the like.

Referring to FIG. 6, the active layer 540 may be disposed on a substrate 510. A first buffer layer 530 and a main light shield layer 520 may be disposed below the active layer 540. The substrate 510 may be a glass substrate, a plastic substrate, or the like. The substrate 510 may also be a flexible substrate, a bendable substrate, a stretchable substrate, or the like.

Referring to FIG. 6, the active layer 540 may include a channel area 543, a first area 541 located on one side of the channel area 543, and a second area 542 located on the other side of the channel area 543. For example, the active layer 540 may be an oxide semiconductor layer. In some cases, the active layer 540 may be a polycrystalline silicon (poly-Si) semiconductor layer or an amorphous silicon (a-Si) semiconductor layer.

Referring to FIG. 6, the first area 541 may include a first main conductorized portion 541M and a first induced conductorized portion 541F. The second area 542 may include a second main conductorized portion 542M and a second induced conductorized portion 542F.

The first main conductorized portion 541M and the second main conductorized portion 542M are connecting portions electrically connected to the main source electrode 561 and the main drain electrode 562, respectively. The first induced conductorized portion 541F is not directly connected to the main source electrode 561, and the second induced conductorized portion 542F is not directly connected to the main drain electrode 562.

Referring to FIG. 6, the gate insulator layer 550 may be located above the active layer 540. The gate insulator layer 550 may have a first contact hole through which a portion of the first main conductorized portion 541M is exposed and a second contact hole through which a portion of the second main conductorized portion 542M is exposed.

Referring to FIG. 6, the main source electrode 561, the main drain electrode 562, and the gate electrode 563 may be located on the gate insulator layer 550. For example, the main source electrode 561, the main drain electrode 562, and the gate electrode 563 may be located on the same layer and formed of the same material.

Referring to FIG. 6, the main source electrode 561 may be electrically connected to the first main conductorized portion 541M through the first contact hole. The main drain electrode 562 may be electrically connected to the second main conductorized portion 542M through the second contact hole. The gate electrode 563 may overlap the channel area 543.

Referring to FIG. 6, the first induced conductorized portion 541F may be located between the first main conductorized portion 541M and the channel area 543. The second induced conductorized portion 542F may be located between the second main conductorized portion 542M and the channel area 543.

Referring to FIG. 6, the first induced conductorized portion 541F may not overlap or be directly connected to the main source electrode 561, and may overlap a portion of one side of the main light shield layer 520. The second induced conductorized portion 542F may not overlap or be directly connected to the main drain electrode 562, and may overlap a portion of the other side of the main light shield layer 520.

Referring to FIG. 6, the first induced conductorized portion 541F may not overlap the main source electrode 561 or the gate electrode 563. Thus, no metal layer is present above the first induced conductorized portion 541F. Thus, as will be described later, the first induced conductorized portion 541F of the active layer 540 may reduce the resistance of the corresponding area of the active layer 540 due to a gate field generated in the main light shield layer 520, thereby providing a process or an effect similar to conductorization.

Referring to FIG. 6, the second induced conductorized portion 542F may not overlap the main drain electrode 562 or the gate electrode 563. Thus, no metal layer is present above the second induced conductorized portion 542F of the active layer 540. Thus, as will be described later, the second induced conductorized portion 542F of the active layer 540 may reduce the resistance of the corresponding area of the active layer 540 due to a gate field generated in the main light shield layer 520, thereby providing an effect similar to conductorization.

Referring to FIG. 6, the gate insulator layer 550 may be disposed above and overlap the first induced conductorized portion 541F. The gate insulator layer 550 may be disposed above and overlap the second induced conductorized portion 542F. That is, in the display device according to embodiments, each of the TFTS may have a structure in which the gate insulator layer 550 is not etched (hereinafter, referred to as a gate insulator layer (GI) etchless structure) between a source contact area and the channel area and between a drain contact area and the channel area.

Thus, it is possible to prevent the active layer 540 of the TFT from being removed or lost and prevent the source contact portion between the main source electrode 561 and the first main conductorized portion 541M and the drain contact portion between the main drain electrode 562 and the second main conductorized portion 542M from being damaged.

Referring to FIG. 6, the electrical conductivity of the first induction conductorized portion 541F may be different from that of the first main conductorized portion 541M. Thus, the first main conductorized portion 541M and the first induction conductorized portion 541F may be distinguished from each other in the first area 541, depending on the difference in electrical conductivity between the first main conductorized portion 541M and the first induction conductorized portion 541F.

Referring to FIG. 6, the electrical conductivity of the second induction conductorized portion 542F may be different from that of the second main conductorized portion 542M. Thus, the second main conductorized portion 542M and the second induction conductorized portion 542F may be distinguished from each other in the second area 542, depending on the difference in electrical conductivity between the second main conductorized portion 542M and the second induction conductorized portion 542F.

Among the first main conductorized portion 541M, the first induction conductorized portion 541F, and the channel area 543, the first main conductorized portion 541M may have highest electrical conductivity, and the channel area 543 may have lowest electrical conductivity.

Among the second main conductorized portion 542M, the second induction conductorized portion 542F, and the channel area 543, the second main conductorized portion 542M may have highest electrical conductivity, and the channel area 543 may have lowest electrical conductivity.

Referring to FIG. 6, the main light shield layer 520 may be disposed to overlap the channel area 543 of the TFT.

When the channel area 543 of the active layer 540 is exposed to light, channel characteristics of the active layer 540 may be changed, thereby changing operating characteristics of the TFT.

Thus, disposing the main light shield layer 520 to overlap the channel area 543 of the TFT may prevent the channel area 543 from being exposed to light. Accordingly, reliable operating characteristics of the TFT may be provided.

In addition, although not shown, the main light shield layer 520 may be electrically connected to one of the gate electrode 563, the main source electrode 561, and the main drain electrode 562.

For example, the main source electrode 561 or the main drain electrode 562 of the TFT may be electrically connected to the main light shield layer 520 through a contact hole extending through the gate insulator layer 550 and the first buffer layer 530.

Electrically connecting the main source electrode 561 or the main drain electrode 562 of the TFT to the main light shield layer 520 may stabilize electrical properties (e.g., threshold voltage characteristics) of the TFT. For example, when the main source electrode 561 or the main drain electrode 562 of the TFT is in electrical contact with the main light shield layer 520, an abnormal shift of the threshold voltage corresponding to a unique characteristic value of the TFT may be prevented.

Figure 7:
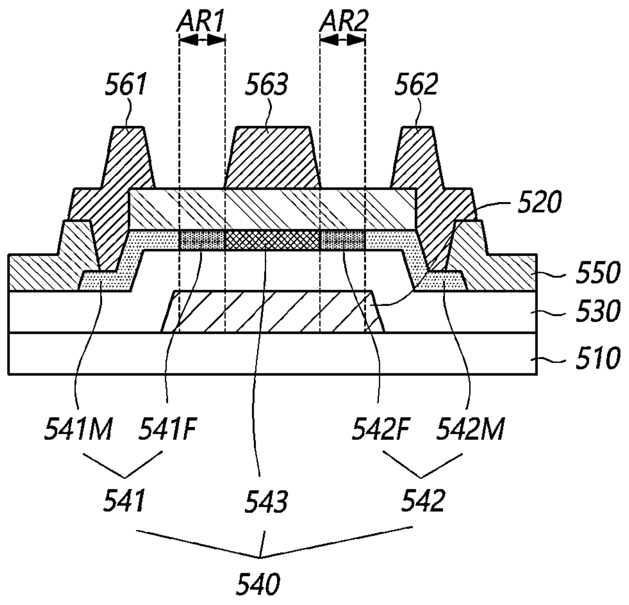
FIG. 7 is a cross-sectional diagram illustrating structural features of a TFT provided in the display device according to embodiments.

FIG. 7 is a cross-sectional diagram illustrating structural features of a TFT provided in the display device according to embodiments.

Referring to FIG. 7, the first induction conductorized portion 541F may not overlap the main source electrode 561 or the gate electrode 563. Thus, no metal layer is present above the first induction conductorized portion 541F of the active layer 540. In contrast, below the active layer 540, the main light shield layer 520 is disposed to overlap the first induction conductorized portion 541F and the second induction conductorized portion 542F of the active layer 540.

As described above, the main light shield layer 520 may be electrically connected to one of the gate electrode 563, the main source electrode 561, or the main drain electrode 562.

The electrically connected main light shield layer 520 may generate a gate field. The resistance of a first induction area AR1, i.e., the corresponding area of the active layer 540 disposed above and overlapping the main light shield layer 520, may be reduced. In this manner, an effect similar to conductorization may be obtained, thereby forming the first induction conductorized portion 541F.

The electrically connected main light shield layer 520 may generate a gate field. The resistance of a second induction area AR2, i.e., the corresponding area of the active layer 540 disposed above and overlapping the main light shield layer 520, may be reduced. In this manner, an effect similar to conductorization may be obtained, thereby forming the second induction conductorized portion 542F.

Referring to FIG. 7, the first induction conductorized portion 541F and the second induction conductorized portion 542F may be formed without separate conductorization processing, thereby reducing the length of the channel area 543 of the active layer 540. Thus, a short channel of the TFT may be easily realized. Accordingly, the mobility of the TFT may be improved.

FIGS. 8 to 18 are cross-sectional diagrams illustrating other structures of TFTs provided in the display device according to embodiments.

Figure 8:
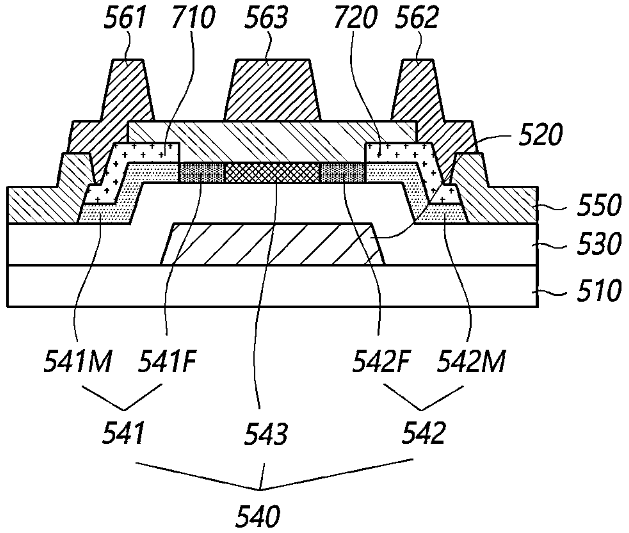
FIGS. 8 to 18 are cross-sectional diagrams illustrating other structures of TFTs provided in the display device according to embodiments.

Referring to FIGS. 8, the display device according to embodiments may further include a sub-source electrode 710 and a sub-drain electrode 720.

The sub-source electrode 710 may be located between the gate insulator layer 550 and the active layer 540, be in electrical contact with the main source electrode 561, and be in electrical contact with the first main conductorized portion 541M through a first contact hole.

Thus, the main source electrode 561 may be electrically connected to the first main conductorized portion 541M through the sub-source electrode 710.

The sub-drain electrode 720 may be located between the gate insulator layer 550 and the active layer 540, be in electrical contact with the main drain electrode 562, and be in electrical contact with the second main conductorized portion 542M through a second contact hole.

Thus, the main drain electrode 562 may be electrically connected to the second main conductorized portion 542M through the sub-drain electrode 720.

Referring to FIG. 8, the sub-source electrode 710 and the sub-drain electrode 720 may contain the same material and be located on the same layer. For example, each of the sub-source electrode 710 and the sub-drain electrode 720 may be a reactive metal layer.

The sub-source electrode 710 may be a reactive metal layer that reduces the first main conductorized portion 541M. For example, the sub-source electrode 710 may contain at least one selected from the group consisting of Al, Ti, Mo, or alloys thereof.

The sub-drain electrode 720 may be a reactive metal layer that reduces the second main conductorized portion 542M. For example, the sub-drain electrode 720 may contain at least one selected from the group consisting of Al, Ti, Mo, or alloys thereof.

The sub-source electrode 710 and the sub-drain electrode 720 may be formed of the same material.

The main source electrode 561 and the main drain electrode 562 may contain the same material and be located on the same layer as the gate electrode 563. For example, the main source electrode 561, the main drain electrode 562, and the gate electrode 563 may contain at least one selected from the group consisting of Ag, Al, Mg, Cr, Ti, Ni, W, Au, Ta, Nd, Cu, Co, Fe, Mo, Pt, or alloys thereof.

Figure 9:
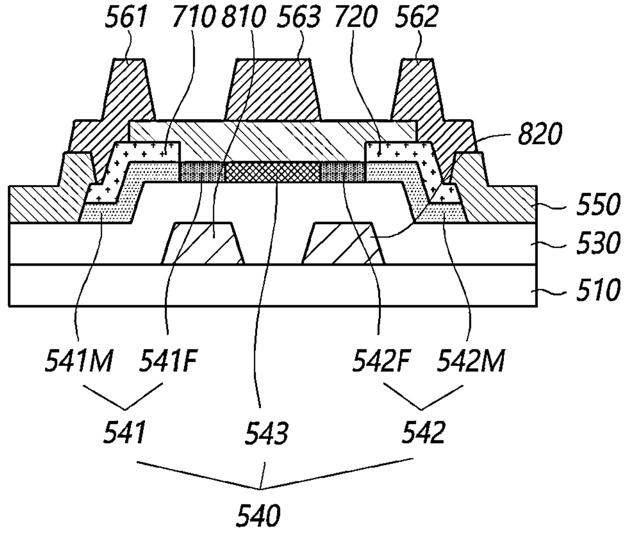

Referring to FIG. 9, in the display device according to embodiments, the main light shield layer may include a first main light shield layer 810 and a second main light shield layer 820.

The first main light shield layer 810 may be located to overlap the first induction conductorized portion 541F, and the second main light shield layer 820 may be located to overlap the second induction conductorized portion 542F.

The first main light shield layer 810 and the second main light shield layer 820 may be disposed to be spaced apart from each other.

In addition, although not shown, the first main light shield layer 810 and the second main light shield layer 820 may be electrically connected to one of the gate electrode 563, the main source electrode 561, or the main drain electrode 562.

The first main light shield layer 810 may generate a gate field. The resistance of the corresponding area of the active layer 540 disposed above in an overlapping manner may be reduced. In this manner, an effect similar to conductorization may be obtained, thereby forming the first induction conductorized portion 541F.

The second main light shield layer 820 may generate a gate field. The resistance of the corresponding area of the active layer 540 disposed above in an overlapping manner may be reduced. In this manner, an effect similar to conductorization may be obtained, thereby forming the second induction conductorized portion 542F.

Figure 10:
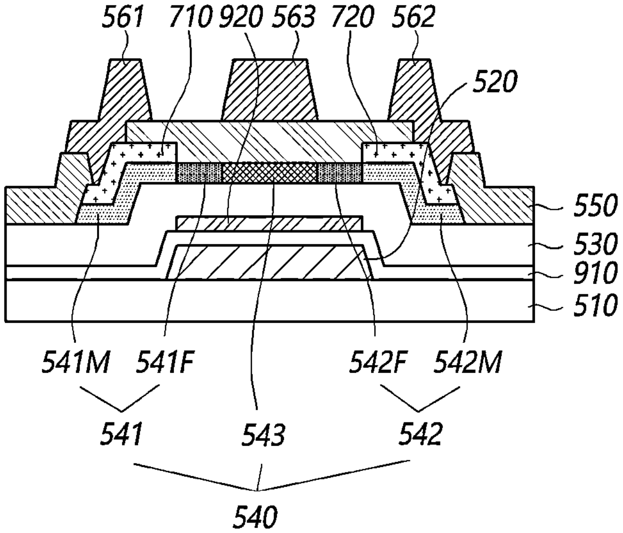

Referring to FIG. 10, the display device according to embodiments may include a second buffer layer 910 located above the main light shield layer 520 and a sub-light shield layer 920 located above the second buffer layer 910 and overlapping the main light shield layer 520.

Referring to FIG. 10, the first induction conductorized portion 541F may overlap a portion of one side of the sub-light shield layer 920. The second induction conductorized portion 542F may overlap a portion of the other side of the sub-light shield layer 920.

In addition, although not shown, the sub-light shield layer 920 may be electrically connected to one of the gate electrode 563, the main source electrode 561, or the main drain electrode 562.

The electrically connected sub-light shield layer 920 may generate a gate field. The resistance of the corresponding area of the active layer 540 disposed above in an overlapping manner may be reduced. In this manner, an effect similar to conductorization may be obtained, thereby forming the first induction conductorized portion 541F.

The electrically connected sub-light shield layer 920 may generate a gate field. The resistance of the corresponding area of the active layer 540 disposed above in an overlapping manner may be reduced. In this manner, an effect similar to conductorization may be obtained, thereby forming the second induction conductorized portion 542F.

The specific resistance of the main light shield layer 520 may be lower than that of the sub-light shield layer 920. For example, the main light shield layer 520 may contain one selected from the group consisting of Ag, Al, Mo, Cu, and alloys thereof. For example, the sub-light shield layer 920 may include a conductive oxide containing at least one selected from the group consisting of In, Sn, or Zn.

Figure 11:
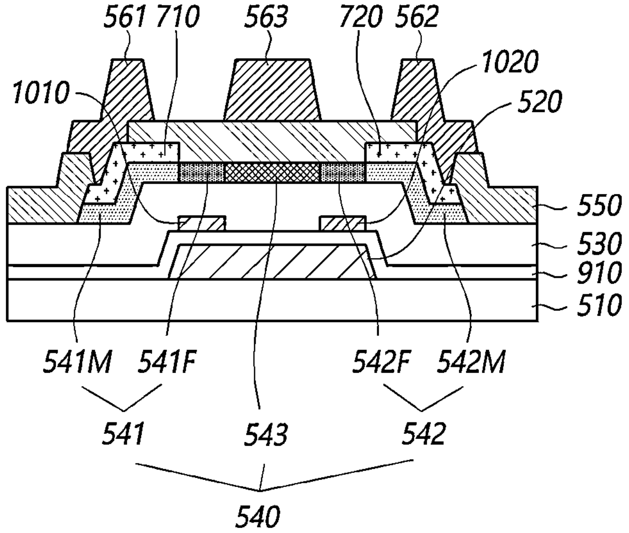

Referring to FIG. 11, in the display device according to embodiments, the sub-light shield layer may include first and second sub-light shield layers 1010 and 1020 located on the second buffer layer 910.

Referring to FIG. 11, the first sub-light shield layer 1010 may be located to overlap the first induction conductorized portion 541F, and the second sub-light shield layer 1020 may be located to overlap the second induction conductorized portion 542F.

The first sub-light shield layer 1010 and the second sub-light shield layer 1020 may be disposed to be spaced apart from each other.

Although not shown, the first sub-light shield layer 1010 and the second sub-light shield layer 1020 may be electrically connected to one of the gate electrode 563, the main source electrode 561, or the main drain electrode 562.

The first sub-light shield layer 1010 may generate a gate field. The resistance of the corresponding area of the active layer 540 disposed above in an overlapping manner may be reduced. In this manner, an effect similar to conductorization may be obtained, thereby forming the first induction conductorized portion 541F.

The second sub-light shield layer 1020 may generate a gate field. The resistance of the corresponding area of the active layer 540 disposed above in an overlapping manner may be reduced. In this manner, an effect similar to conductorization may be obtained, thereby forming the second induction conductorized portion 542F.

Figure 12:
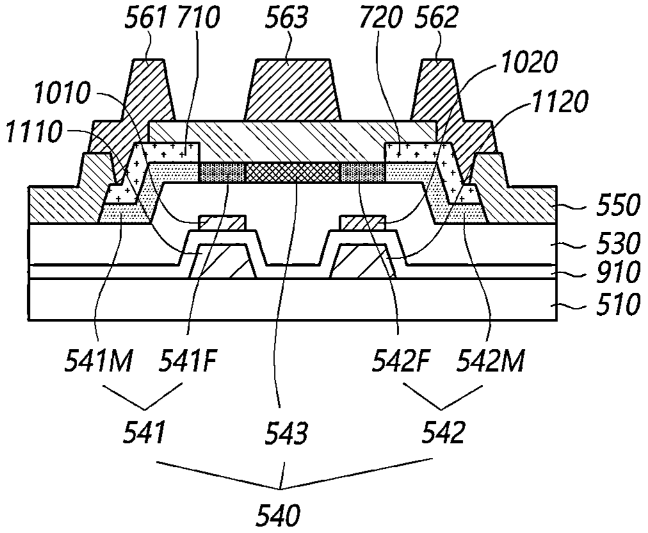

Referring to FIG. 12, in the display device according to embodiments, the main light shield layer may include a first main light shield layer 1110 and a second main light shield layer 1120, and the sub-light shield layer may include a first sub-light shield layer 1010 located on the first main light shield layer 1110 and a second sub-light shield layer 1020 located on the second main light shield layer 1120.

Referring to FIG. 12, the first main light shield layer 1110, the first sub-light shield layer 1010, and the first induction conductorized portion 541F may be disposed to overlap each other.

Referring to FIG. 12, the second main light shield layer 1120, the second sub-light shield layer 1020, and the second induction conductorized portion 542F may be disposed to overlap each other.

Figure 13:
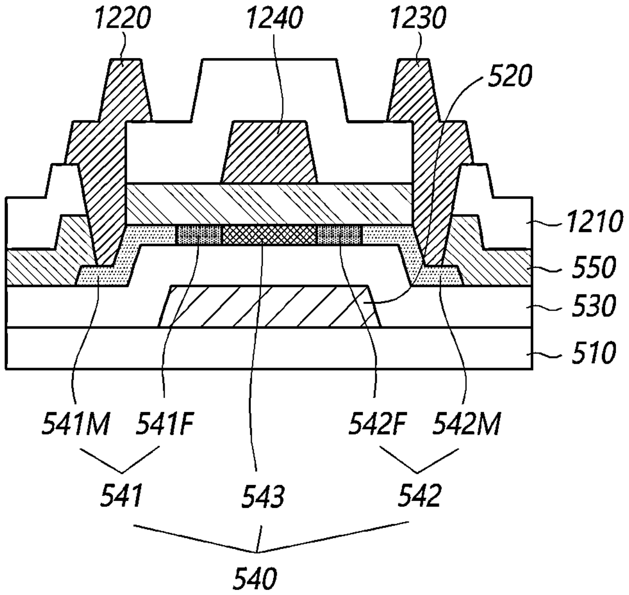

Referring to FIG. 13, the display device according to embodiments may include a passivation layer 1210 located on a gate electrode 1240, a main source electrode 1220, and a main drain electrode 1230.

Referring to FIG. 13, the main source electrode 1220 may be located on the passivation layer 1210 and electrically connected to the first main conductorized portion 541M.

Referring to FIG. 13, the main drain electrode 1230 may be located on the passivation layer 1210 and electrically connected to the second main conductorized portion 542M.

The main source electrode 1220 and the main drain electrode 1230 may contain a different material and be located on a different layer from the gate electrode 1240. For example, the main source electrode 1220, the main drain electrode 1230, and the gate electrode 1240 may contain at least one selected from the group consisting of Ag, Al, Mg, Cr, Ti, Ni, W, Au, Ta, Nd, Cu, Co, Fe, Mo, Pt, or alloys thereof, but the material of the gate electrode 1240 may be different from the material of either the main source electrode 1220 or the main drain electrode 1230.

Figure 14:
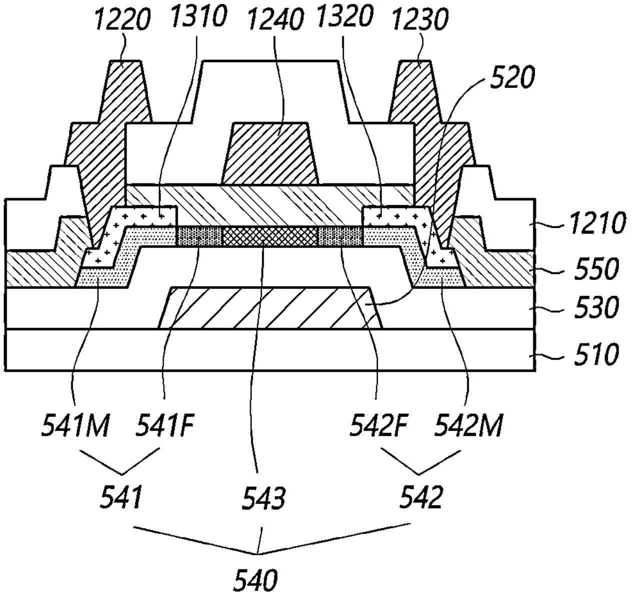

Referring to FIG. 14, the display device according to embodiments may further include a sub-source electrode 1310 and a sub-drain electrode 1320.

The sub-source electrode 1310 may be located between the gate insulator layer 550 and the active layer 540, be in electrical contact with the main source electrode 1220, and be in electrical contact with the first main conductorized portion 541M through a first contact hole.

Thus, the main source electrode 1220 may be electrically connected to the first main conductorized portion 541M through the sub-source electrode 1310.

The sub-drain electrode 1320 may be located between the gate insulator layer 550 and the active layer 540, be in electrical contact with the main drain electrode 1230, and be in electrical contact with the second main conductorized portion 542M through a second contact hole.

Accordingly, the main drain electrode 1230 may be electrically connected to the second main conductorized portion 542M through the sub-drain electrode 1320.

Referring to FIG. 14, the sub-source electrode 1310 and the sub-drain electrode 1320 may contain the same material and be located on the same layer. For example, each of the sub-source electrode 1310 and the sub-drain electrode 1320 may be a reactive metal layer.

The sub-source electrode 1310 may be a reactive metal layer that reduces the first main conductorized portion 541M. For example, the sub-source electrode 1310 may contain at least one selected from the group consisting of Al, Ti, Mo, or alloys thereof.

The sub-drain electrode 1320 may be a reactive metal layer that reduces the second main conductorized portion 542M. For example, the sub-drain electrode 1320 may contain at least one selected from the group consisting of Al, Ti, Mo, or alloys thereof.

The sub-source electrode 1310 and the sub-drain electrode 1320 may be formed of the same material.

Figure 15:
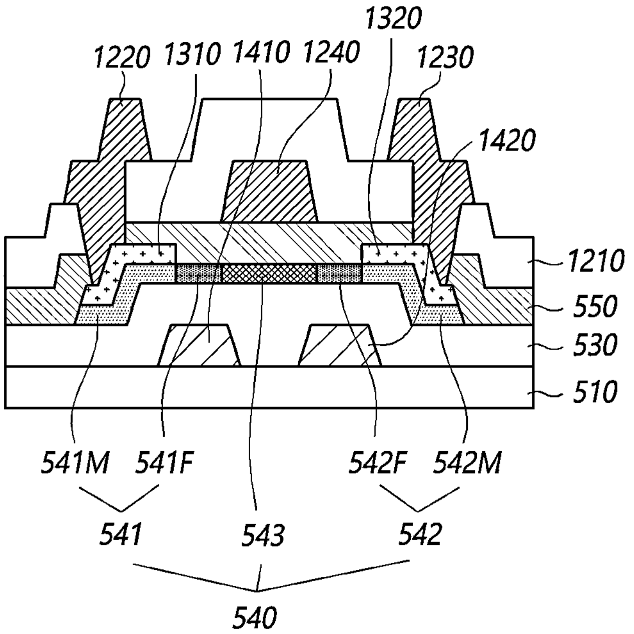

Referring to FIG. 15, in the display device according to embodiments, the main light shield layer may include a first main light shield layer 1410 and a second main light shield layer 1420.

The first main light shield layer 1410 may be located to overlap the first induction conductorized portion 541F, and the second main light shield layer 1420 may be located to overlap the second induction conductorized portion 542F.

The first main light shield layer 1410 and the second main light shield layer 1420 may be disposed to be spaced apart from each other.

In addition, although not shown, the first main light shield layer 1410 and the second main light shield layer 1420 may be electrically connected to one of the gate electrode 1240, the main source electrode 1220, or the main drain electrode 1230.

The first main light shield layer 1410 may generate a gate field. The resistance of the corresponding area of the active layer 540 disposed above in an overlapping manner may be reduced. In this manner, an effect similar to conductorization may be obtained, thereby forming the first induction conductorized portion 541F.

The second main light shield layer 1420 may generate a gate field. The resistance of the corresponding area of the active layer 540 disposed above in an overlapping manner may be reduced. In this manner, an effect similar to conductorization may be obtained, thereby forming the second induction conductorized portion 542F.

Figure 16:
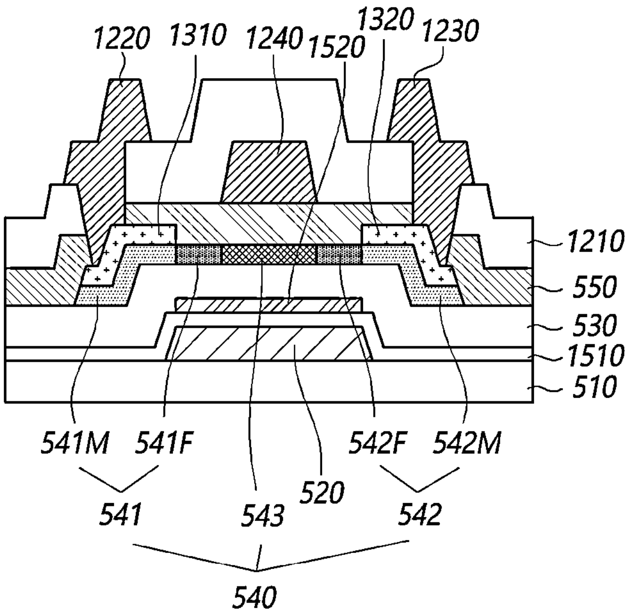

Referring to FIG. 16, the display device according to embodiments may include a second buffer layer 1510 located on the main light shield layer 520 and a sub-light shield layer 1520 located on the second buffer layer 1510 and overlapping the main light shield layer 520.

Referring to FIG. 16, the first induction conductorized portion 541F may overlap a portion of one side of the sub-light shield layer 1520. The second induction conductorized portion 542F may overlap a portion of the other side of the sub-light shield layer 1520.

In addition, although not shown, the sub-light shield layer 1520 may be electrically connected to one of the gate electrode 1240, the main source electrode 1220, or the main drain electrode 1230.

The electrically connected sub-light shield layer 1520 may generate a gate field. The resistance of the corresponding area of the active layer 540 disposed above in an overlapping manner may be reduced. In this manner, an effect similar to conductorization may be obtained, thereby forming the first induction conductorized portion 541F.

The electrically connected sub-light shield layer 1520 may generate a gate field. The resistance of the corresponding area of the active layer 540 disposed above in an overlapping manner may be reduced. In this manner, an effect similar to conductorization may be obtained, thereby forming the second induction conductorized portion 542F.

Figure 17:
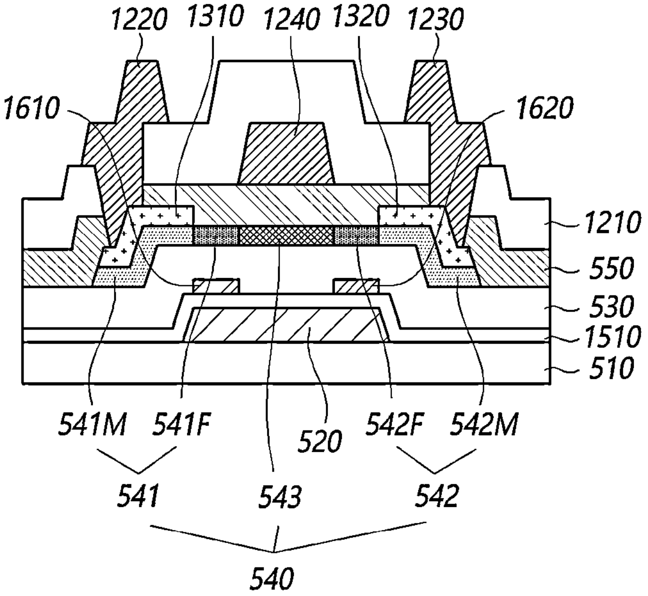

Referring to FIG. 17, in the display device according to embodiments, the sub-light shield layer may first and second sub-light shield layers 1610 and 1620 located on the second buffer layer 1510.

Referring to FIG. 17, the first sub-light shield layer 1610 may be located to overlap the first induction conductorized portion 541F, and the second sub-light shield layer 1620 may be located to overlap the second induction conductorized portion 542F.

The first sub-light shield layer 1610 and the second sub-light shield layer 1620 may be disposed to be spaced apart from each other.

In addition, although not shown, the first sub-light shield layer 1610 and the second sub-light shield layer 1620 may be electrically connected to one of the gate electrode 1240, the main source electrode 1220, or the main drain electrode 1230.

The first sub-light shield layer 1610 may generate a gate field. The resistance of the corresponding area of the active layer 540 disposed above in an overlapping manner may be reduced. In this manner, an effect similar to conductorization may be obtained, thereby forming the first induction conductorized portion 541F.

The second sub-light shield layer 1620 may generate a gate field. The resistance of the corresponding area of the active layer 540 disposed above in an overlapping manner may be reduced. In this manner, an effect similar to conductorization may be obtained, thereby forming the second induction conductorized portion 542F.

Figure 18:
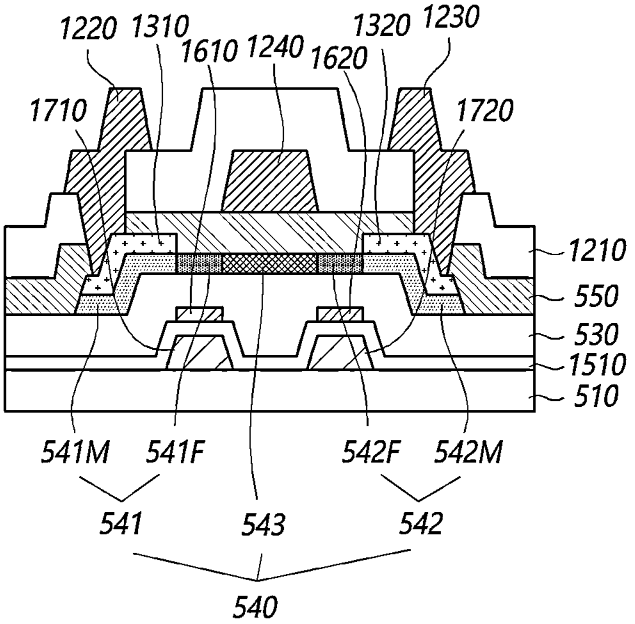

Referring to FIG. 18, in the display device according to embodiments, the main light shield layer may include a first main light shield layer 1710 and a second main light shield layer 1720, and the sub-light shield layer may include a first sub-light shield layer 1610 located on the first main light shield layer 1710 and a second sub-light shield layer 1620 located on the second main light shield layer 1720.

Referring to FIG. 18, the first main light shield layer 1710, the first sub-light shield layer 1610, and the first induction conductorized portion 541F may be disposed to overlap each other.

Referring to FIG. 18, the second main light shield layer 1720, the second sub-light shield layer 1620, and the second induction conductorized portion 542F may be disposed to overlap each other.

Figure 19A:
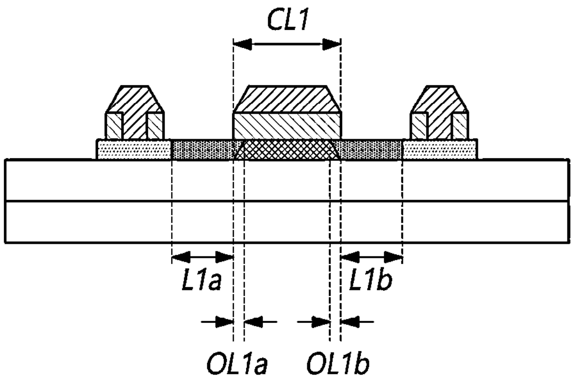
FIGS. 19A and 19B are cross-sectional diagrams illustrating the minimization of the channel length through arrangement of the light shield layer in the display device according to embodiments.
Figure 19B:
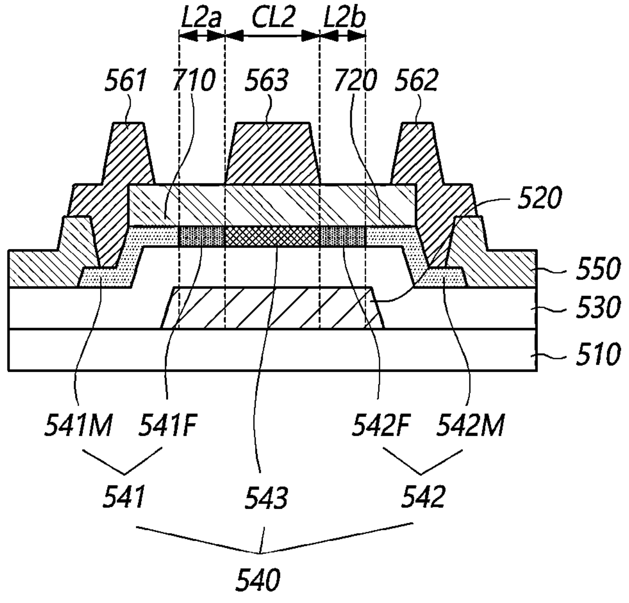

FIGS. 19A and 19B are cross-sectional diagrams illustrating the minimization of the channel length through arrangement of the light shield layer in the display device according to embodiments.

Referring to FIG. 19A, in conductorization processing of the active layer by hydrogen diffusion, hydrogen conductorization occurs by the lengths L1*a* and L1*b* of etch areas defined by interruption of the gate insulator layer. However, hydrogen that has permeated into the etch areas may diffuse by the length CL1 of the channel area located below the gate electrode, thereby increasing the conductorized areas OL1*a* and OL1*b*. Thus, the channel area having an incomplete area may be formed.

Thus, since the channel area includes incomplete conductorized areas OL1*a* and OL1*b*, there are limitations in forming the short channel. Consequently, the mobility of the TFT may be reduced.

Referring to FIG. 19B, in the display device according to embodiments, each of the TFTS has a GI etchless structure between the source contact area and the channel area and between the drain contact area and the channel area.

Thus, the active layer 540 of the TFT may be prevented from being removed. In the TFT, the source contact portion between the main source electrode 561 and the first main conductorized portion 541M and the drain contact portion between the main drain electrode 562 and the second main conductorized portion 542M may be prevented from being damaged.

In addition, the resistance is reduced by the lengths L2*a* and L2*b* of the corresponding area of the active layer 540 due to the gate field generated in the main light shield layer 520, thereby causing an effect similar to conductorization. Thus, in the channel area, the first induction conductorized portion 541F and the second induction conductorized portion 542F may be formed without separate conductorization processing, and the length CL2 of the channel area of the active layer 540 may be reduced.

Accordingly, the short channel of the TFT may be easily formed, thereby improving the mobility of the TFT.

Figure 20:
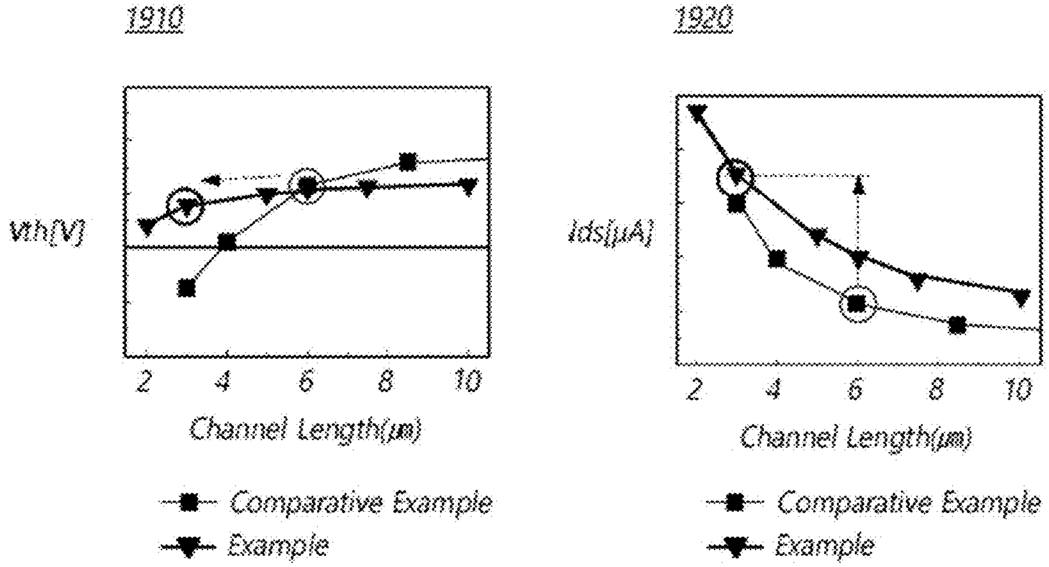
FIG. 20 illustrates graphs of threshold voltages and drain currents according to changes in channel lengths in TFTs having the structures of FIGS. 19A and 19B in the display device according to embodiments.

FIG. 20 illustrates graphs of threshold voltages and drain currents according to changes in channel lengths in TFTs having the structures of FIGS. 19A and 19B in the display device according to embodiments.

Referring to FIG. 20, a left graph 1910 illustrates threshold voltages according to changes in the channel length in a comparative example in which the TFT structure illustrated in FIG. 19A is used and in an example of the present disclosure in which the TFT structure illustrated in FIG. 19B is used, and a right graph 1920 illustrates drain currents according to changes in the channel length in the comparative example in which the TFT structure illustrated in FIG. 19A is used and in the example of the present disclosure in which the TFT structure illustrated in FIG. 19B is used.

Referring to FIG. 20, in the left graph 1910, in the case of the comparative example, it may be viewed that the threshold voltage is changed when the channel length is changed. In particular, in the comparative example, it may be viewed that the threshold voltage is significantly changed when the channel length is 6 μm or less. In contrast, in the case of the example of the present disclosure illustrated in the left graph 1910, it may be viewed that the threshold voltage is not significantly changed when the channel length is changed.

Referring to FIG. 20, in the right graph 1920, it may be viewed that current performance according to the channel length is improved in the example of the present disclosure compared to the comparative example.

Figure 21:
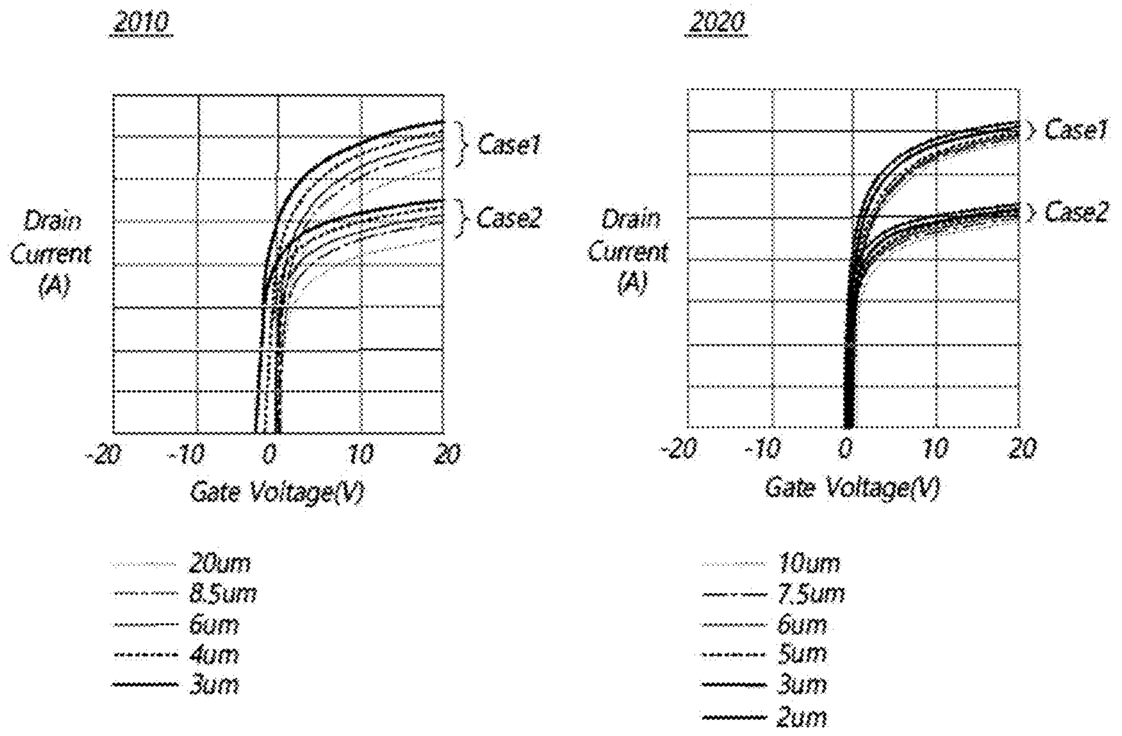
FIG. 21 illustrates graphs of drain currents according to changes in gate voltage according to the channel length in TFTs having the structures illustrated in FIGS. 19A and 19B in the display device according to embodiments.

FIG. 21 illustrates graphs of drain currents according to changes in gate voltage according to the channel length in TFTs having the structures illustrated in FIGS. 19A and 19B in the display device according to embodiments.

Referring to FIG. 21, a left graph 2010 illustrates drain currents according to changes in the gate voltage according to the channel length when the TFT structure illustrated in FIG. 19A is used, and a right graph 2020 illustrates drain currents according to changes in the gate voltage according to the channel length when the TFT structure illustrated in FIG. 19B is used.

Referring to FIG. 21, for each of a case in the left graph 2010 in which the TFT structure illustrated in FIG. 19A is used and a case in the right graph 2020 in which the TFT structure according to embodiments is used, repeated experiments were performed on two cases (Case 1 and Case 2) when performing an experiment of measuring an intended level of reference drain current according to changes in the gate voltage. In the first case, Case 1, the drain-source voltage Vds of the TFT is a high voltage, e.g., 10 V. In the second case, Case 2, the drain-source voltage Vds of the TFT is a low voltage, e.g., 0.1 V.

Referring to FIG. 21, when the left graph 2010 and the right graph 2020 are compared, it may be viewed that in the left graph 2010, the drain currents according to the gate voltage had large variations according to the channel length, but in the right graph 2020, the drain currents according to the gate voltage according to the channel length were measured to be in similar levels.

Thus, the TFT structure according to embodiments may prevent the active layer 540 of the TFT from being removed. In the TFT, the source contact portion between the main source electrode 561 and the first main conductorized portion 541M and the drain contact portion between the main drain electrode 562 and the second main conductorized portion 542M may be prevented from being damaged. In addition, the drain current according to the gate voltage shows an intended level.

Here, the drain current according to the gate voltage showing an intended level may mean that the TFT having a TFT structure according to embodiments has intended levels of switching characteristics (i.e., on-off characteristics) and mobility performance.

The above-described embodiments of the present disclosure will be briefly reviewed as follows.

The thin film transistor (TFT) according to embodiments may include: a substrate; a main light shield layer located on the substrate; a first buffer layer located on the main light shield layer; an active layer located on the first buffer layer and including a channel area, a first area located on one side of the channel area, and a second area located on the other side of the channel area, wherein the first area includes a first main conductorized portion and a first induced conductorized portion, and the second area includes a second main conductorized portion and a second induced conductorized portion; a gate insulator layer located on the active layer; a main source electrode located on the gate insulator layer and electrically connected to the first main conductorized portion; a main drain electrode located on the gate insulator layer and electrically connected to the second main conductorized portion; and a gate electrode located on the gate insulator layer and overlapping the channel area.

The first induced conductorized portion may be located between the first main conductorized portion and the channel area, may not overlap the main source electrode, and may overlap a portion of one side of the main light shield layer.

The second induced conductorized portion may be located between the second main conductorized portion and the channel area, may not overlap the main drain electrode, and may overlap a portion of the other side of the main light shield layer.

The main light shield layer may be electrically connected to one of the gate electrode, the main source electrode, or the main drain electrode.

The main light shield layer may include a first main light shield layer and a second main light shield layer.

The first main light shield layer may be located to overlap the first induced conductorized portion.

The second main light shield layer may be located to overlap the second induced conductorized portion.

The first main light shield layer and the second main light shield layer may be disposed to be spaced apart from each other.

The TFT according to embodiments may further include a sub-source electrode located on the first main conductorized portion and a sub-drain electrode located on the second main conductorized portion.

The sub-source electrode may be a reactive metal layer that reduces the first main conductorized portion.

The sub-drain electrode may be a reactive metal layer that reduces the second main conductorized portion.

The TFT according to embodiments may further include: a second buffer layer located on the main light shield layer; and a sub-light shield layer located on the second buffer layer and overlapping the main light shield layer.

The first induced conductorized portion may overlap a portion of one side of the sub-light shield layer.

The second induced conductorized portion may overlap a portion of the other side of the sub-light shield layer.

The sub-light shield layer may be electrically connected to one of the gate electrode, the main source electrode, or the main drain electrode.

The sub-light shield layer may include a first sub-light shield layer and a second sub-light shield layer.

The first sub-light shield layer may be located to overlap the first induced conductorized portion.

The second sub-light shield layer may be located to overlap the second induced conductorized portion.

The first sub-light shield layer and the second sub-light shield layer may be disposed to be spaced apart from each other.

The main light shield layer may include a first main light shield layer and a second main light shield layer.

The first main light shield layer may be located to overlap the first induced conductorized portion and the first sub-light shield layer.

The second main light shield layer may be located to overlap the second induced conductorized portion and the second sub-light shield layer.

The first main light shield layer and the second main light shield layer are disposed to be spaced apart from each other.

At least one of the main light shield layer or the sub-light shield layer may be electrically connected to one of the gate electrode, the main source electrode, or the main drain electrode.

Each of the gate electrode, the main source electrode, and the main drain electrode may include at least one selected from the group consisting of Ag, Al, Mg, Cr, Ti, Ni, W, Au, Ta, Nd, Cu, Co, Fe, Mo, Pt, or alloys thereof.

The gate electrode, the main source electrode, and the main drain electrode may include the same material.

The gate electrode may include a different material from the main source electrode and the main drain electrode.

Each of the sub-source electrode and the sub-drain electrode may include at least one selected from the group consisting of Al, Ti, Mo, or alloys thereof.

Specific resistance of the main light shield layer may be lower than that of the sub-light shield layer.

The main light shield layer may include at least one selected from the group consisting of Ag, Al, Mo, Cu, or alloys thereof.

The sub-light shield layer may include at least one selected from the group consisting of In, Sn, or Zn.

The TFT may further include a passivation layer located on the gate electrode.

The main source electrode may be located on the passivation layer and electrically connected to the first main conductorized portion.

The main drain electrode may be located on the passivation layer and electrically connected to the second main conductorized portion.

The display device according to embodiments may include a substrate on which a plurality of TFTs are disposed. At least one of the plurality of TFTs may include: a main light shield layer located on the substrate; a first buffer layer located on the main light shield layer; an active layer located on the first buffer layer and including a channel area, a first area located on one side of the channel area, and a second area located on the other side of the channel area, wherein the first area includes a first main conductorized portion and a first induced conductorized portion, and the second area includes a second main conductorized portion and a second induced conductorized portion; a gate insulator layer located on the active layer; a main source electrode located on the gate insulator layer and electrically connected to the first main conductorized portion; a main drain electrode located on the gate insulator layer and electrically connected to the second main conductorized portion; and a gate electrode located on the gate insulator layer and overlapping the channel area. The first induced conductorized portion may be located between the first main conductorized portion and the channel area, may not overlap the main source electrode, and may overlap a portion of one side of the main light shield layer. The second induced conductorized portion may be located between the second main conductorized portion and the channel area, may not overlap the main drain electrode, and may overlap a portion of the other side of the main light shield layer.

According to embodiments, a TFT having a structure able to remove or minimize the possibility that a semiconductor layer may be damaged and a display device including the same may be provided.

According to embodiments, a TFT having a structure able to provide superior electrical properties (e.g., current characteristics or mobility) while removing or minimizing the possibility that a semiconductor layer may be damaged and a display device including the same may be provided.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure.

What is claimed is:

1. A thin film transistor comprising:

a substrate;

a main light shield layer located on the substrate;

a first buffer layer located on the main light shield layer;

an active layer located on the first buffer layer and comprising a channel area, a first area located on one side of the channel area, and a second area located on another side of the channel area, wherein the first area comprises a first main conductorized portion and a first induced conductorized portion, and the second area comprises a second main conductorized portion and a second induced conductorized portion;

a gate insulator layer located on the active layer;

a sub-source electrode located on the first main conductorized portion and is a reactive metal layer that reduces the first main conductorized portion;

a sub-drain electrode located on the second main conductorized portion and is a reactive metal layer that reduces the second main conductorized portion;

a main source electrode located on the gate insulator layer and electrically connected to the first main conductorized portion through the sub-source electrode;

a main drain electrode located on the gate insulator layer and electrically connected to the second main conductorized portion through the sub-drain electrode; and a gate electrode located on the gate insulator layer and overlapping the channel area, wherein the first induced conductorized portion is located between the first main conductorized portion and the channel area, does not overlap the main source electrode, and overlaps a portion of one side of the main light shield layer, and the second induced conductorized portion is located between the second main conductorized portion and the channel area, does not overlap the main drain electrode, and overlaps a portion of another side of the main light shield layer, wherein the main light shield layer is electrically connected to one of the gate electrode, the main source electrode, or the main drain electrode.

2. The thin film transistor according to claim 1, wherein the main light shield layer comprises a first main light shield layer and a second main light shield layer, the first main light shield layer overlaps the first induced conductorized portion, the second main light shield layer overlaps the second induced conductorized portion, and the first main light shield layer and the second main light shield layer are spaced apart from each other.

3. The thin film transistor according to claim 1, further comprising:

a second buffer layer located on the main light shield layer; and a sub-light shield layer located on the second buffer layer and overlapping the main light shield layer, wherein the first induced conductorized portion overlaps a portion of one side of the sub-light shield layer, and the second induced conductorized portion overlaps a portion of another side of the sub-light shield layer.

4. The thin film transistor according to claim 3, wherein the sub-light shield layer is electrically connected to one of the gate electrode, the main source electrode, or the main drain electrode.

5. The thin film transistor according to claim 4, wherein the sub-light shield layer comprises a first sub-light shield layer and a second sub-light shield layer, wherein the first sub-light shield layer overlaps the first induced conductorized portion, the second sub-light shield layer overlaps the second induced conductorized portion, and the first sub-light shield layer and the second sub-light shield layer are spaced apart from each other.

6. The thin film transistor according to claim 5, wherein the main light shield layer comprises a first main light shield layer and a second main light shield layer, wherein the first main light shield layer overlaps the first induced conductorized portion and the first sub-light shield layer, the second main light shield layer overlaps the second induced conductorized portion and the second sub-light shield layer, and the first main light shield layer and the second main light shield layer are spaced apart from each other.

7. The thin film transistor according to claim 1, wherein each of the gate electrode, the main source electrode, and the main drain electrode comprises at least one material selected from a group consisting of Ag, Al, Mg, Cr, Ti, Ni, W, Au, Ta, Nd, Cu, Co, Fe, Mo, Pt, and alloys thereof.

8. The thin film transistor according to claim 7, wherein the gate electrode, the main source electrode, and the main drain electrode comprise a same material.

9. The thin film transistor according to claim 7, wherein the gate electrode comprises a different material from the main source electrode and the main drain electrode.

10. The thin film transistor according to claim 1, wherein each of the sub-source electrode and the sub-drain electrode comprises at least one material selected from a group consisting of Al, Ti, Mo, and alloys thereof.

11. The thin film transistor according to claim 3, wherein a specific resistance of the main light shield layer is lower than the specific resistance of the sub-light shield layer.

12. The thin film transistor according to claim 11, wherein the main light shield layer comprises at least one material selected from a group consisting of Ag, Al, Mo, Cu, and alloys thereof, and the sub-light shield layer comprises at least one material selected from a group consisting of In, Sn, and Zn.

13. The thin film transistor according to claim 9, further comprising a passivation layer located on the gate electrode, the main source electrode is located on the passivation layer and electrically connected to the first main conductorized portion, and the main drain electrode is located on the passivation layer and electrically connected to the second main conductorized portion.

14. A display device comprising a substrate on which a plurality of thin film transistors are disposed, wherein at least one of the plurality of thin film transistors comprises:

a main light shield layer located on the substrate;

a first buffer layer located on the main light shield layer;

an active layer located on the first buffer layer and comprising a channel area, a first area located on one side of the channel area, and a second area located on another side of the channel area, wherein the first area comprises a first main conductorized portion and a first induced conductorized portion, and the second area comprises a second main conductorized portion and a second induced conductorized portion;

a gate insulator layer that is located on the active layer;

a sub-source electrode located on the first main conductorized portion and is a reactive metal layer that reduces the first main conductorized portion;

a sub-drain electrode located on the second main conductorized portion and is a reactive metal layer that reduces the second main conductorized portion;

a main source electrode that is located on the gate insulator layer and that is electrically connected to the first main conductorized portion through the sub-source electrode;

a main drain electrode that is located on the gate insulator layer and that is electrically connected to the second main conductorized portion through the sub-drain electrode; and a gate electrode that is located on the gate insulator layer and that overlaps the channel area, wherein the first induced conductorized portion is located between the first main conductorized portion and the channel area, does not overlap the main source electrode, and overlaps a portion of one side of the main light shield layer, and the second induced conductorized portion is located between the second main conductorized portion and the channel area, does not overlap the main drain electrode, and overlaps a portion of another side of the main light shield layer, wherein the main light shield layer is electrically connected to one of the gate electrode, the main source electrode, or the main drain electrode.

15. A thin film transistor comprising:

a substrate;

a main light shield layer located on the substrate;

a first buffer layer located on the main light shield layer;

a second buffer layer located on the main light shield layer;

a sub-light shield layer located on the second buffer layer and overlapping the main light shield layer;

an active layer located on the first buffer layer and comprising a channel area, a first area located on one side of the channel area, and a second area located on another side of the channel area, wherein the first area comprises a first main conductorized portion and a first induced conductorized portion, and the second area comprises a second main conductorized portion and a second induced conductorized portion;

a gate insulator layer located on the active layer;

a sub-source electrode located on the first main conductorized portion and is a reactive metal layer that reduces the first main conductorized portion;

a sub-drain electrode located on the second main conductorized portion and is a reactive metal layer that reduces the second main conductorized portion;

a main source electrode located on the gate insulator layer and electrically connected to the first main conductorized portion through the sub-source electrode;

a main drain electrode located on the gate insulator layer and electrically connected to the second main conductorized portion through the sub-drain electrode; and a gate electrode located on the gate insulator layer and overlapping the channel area, wherein the first induced conductorized portion is located between the first main conductorized portion and the channel area, does not overlap the main source electrode, and overlaps a portion of one side of the sub-light shield layer, and the second induced conductorized portion is located between the second main conductorized portion and the channel area, does not overlap the main drain electrode, and overlaps a portion of another side of the sub-light shield layer, wherein the sub-light shield layer is electrically connected to one of the gate electrode, the main source electrode, or the main drain electrode.

* * * * *